United States Patent
Watanabe et al.

(10) Patent No.: US 6,876,683 B2
(45) Date of Patent: Apr. 5, 2005

(54) OPTICAL SEMICONDUCTOR DEVICE

(75) Inventors: Tohru Watanabe, Yamanashi (JP);
Toshio Higashi, Yamanashi (JP);
Manabu Komiyama, Kawasaki (JP);
Takashi Yamane, Matsudo (JP)

(73) Assignees: Fujitsu Limited, Kawasaki (JP);
Fujitsu Quantum Devices Limited, Yamanashi (JP)

( * ) Notice: Subject to any disclaimer, the term of this patent is extended or adjusted under 35 U.S.C. 154(b) by 43 days.

(21) Appl. No.: 10/119,211

(22) Filed: Apr. 10, 2002

(65) Prior Publication Data

US 2003/0099266 A1 May 29, 2003

(30) Foreign Application Priority Data

Nov. 28, 2001 (JP) ...................................... 2001-363351

(51) Int. Cl.[7] .............................................. H01S 3/04
(52) U.S. Cl. ....................................... 372/36; 385/94
(58) Field of Search ................... 372/36, 34, 29.014, 372/33, 59; 257/678; 385/94; 438/26

(56) References Cited

U.S. PATENT DOCUMENTS

| | | | | |
|---|---|---|---|---|
| 5,392,305 A | * | 2/1995 | Jakobson | 372/43 |
| 5,513,198 A | * | 4/1996 | Jakobson | 372/43 |
| 5,629,952 A | * | 5/1997 | Bartholomew et al. | 372/33 |
| 5,696,785 A | * | 12/1997 | Bartholomew et al. | 372/59 |
| 5,770,473 A | * | 6/1998 | Hall et al. | 438/26 |
| 6,067,309 A | * | 5/2000 | Onomura et al. | 372/46 |
| 6,220,767 B1 | * | 4/2001 | Bookbinder | 385/94 |
| 6,382,800 B2 | * | 5/2002 | Sato | 257/103 |
| 6,396,023 B1 | * | 5/2002 | Aikiyo | 219/117.1 |
| 6,529,534 B1 | * | 3/2003 | Yasuda | 372/32 |
| 6,618,405 B2 | * | 9/2003 | Kimura et al. | 372/36 |
| 2002/0118715 A1 | * | 8/2002 | Kimura et al. | 372/36 |

FOREIGN PATENT DOCUMENTS

JP        07-147457        6/1995

* cited by examiner

Primary Examiner—Minsun Oh Harvey
Assistant Examiner—Tuan N. Nguyen
(74) Attorney, Agent, or Firm—Westerman, Hattori, Daniels & Adrian, LLP

(57) ABSTRACT

A package for hermetically sealing a semiconductor laser which outputs light having a wavelength of 1.1 μm or more is filled with a gas containing an oxidizing gas such as oxygen or ozone. The oxidizing gas in the package oxidizes hydrogen in the package to prevent hydrogen embrittlement of electrodes that applies stress on electrodes and to suppress variation in the emission wavelength which would otherwise result from the application of stress.

19 Claims, 2 Drawing Sheets

$\Delta \lambda$ is the wavelength variations.

Δλ is the wavelength variations.

OPTICAL SEMICONDUCTOR DEVICE

BACKGROUND OF THE INVENTION

1. Field of the Invention

The present invention relates to optical semiconductor devices for use in optical communications, which output laser beams exhibiting low wavelength variation over time. In particular, the present invention relates to a package of a semiconductor laser device which outputs light having a wavelength of 1.1 $\mu$m or more.

2. Description of the Related Art

Semiconductor lasers that output light having a wavelength of 1.1 $\mu$m or more are widely used as light sources for optical communications using optical fibers or free space as the transmission medium and as light sources for use in scientific and industrial analysis and measurement. In operation, the semiconductor laser is hermetically sealed in the interior of a package in order to prevent deterioration due to environmental factors and contamination caused by foreign matter.

In a known optical semiconductor device comprising a semiconductor laser hermetically sealed in the interior of a package, an inert gas such as nitrogen or helium which has a low reactivity to semiconductor lasers is filled in the interior of the package.

In optical communications, even slight wavelength variation in the light source deteriorates the quality of the communication. Thus, in optical semiconductor devices for use in optical communications, the variation in the output wavelength of the semiconductor lasers needs to be suppressed as much as possible.

Moreover, light having a wavelength of 1.1 $\mu$m or more is used in various scientific and industrial analyses and measurements as well as optical communications. In such applications, suppression of the wavelength variation is also important from the point of view of improving the accuracy of the analysis and measurement.

SUMMARY OF THE INVENTION

An object of the present invention is to provide an optical semiconductor device that outputs a laser beam exhibiting low wavelength variation over time.

According to the investigation conducted by the inventors, in a known optical semiconductor device in which an inert gas is filled in the package, the output wavelength of the semiconductor laser sometimes varies over time. This variation over time is irreversible. The present inventors have found through extensive research that the variation in the output wavelength over time can be suppressed by introducing an oxidizing gas into the package.

The exact cause of wavelength variation over time and the mechanism of suppression of the wavelength variation over time by the introduction of the oxidizing gas are not yet clarified obviously. However, through the experimental results described below, the present inventors suppose that these phenomena are related to hydrogen, and in particular, to hydrogen embrittlement of the electrodes of the semiconductor laser.

The present inventors have made an experiment observing and comparing the variations in the wavelength of the output light over time for semiconductor lasers, each of which has electrodes made of different material from that of each other. Each of the semiconductor lasers used in the experiment, was sealed in the interior of the packages of an optical semiconductor device. In known optical semiconductor devices using an inert gas as the inner gas, significantly large variation in wavelength over time was observed for the semiconductor lasers having electrodes comprising one element selected from the group consisting of titanium (Ti), magnesium (Mg), and vanadium (V). When oxygen was added to the inner gas, the variation in wavelength over time became to be small even for the semiconductor lasers having electrodes comprising Ti, Mg, and V.

Ti, Mg, and V easily absorb hydrogen. The results of the above experiment suggest that hydrogen is involved in the wavelength variation over time. Since hydrogen is sometimes stored in the material which constitutes the package of the optical semiconductor device, hydrogen would be discharged into the interior of the package during operation of the optical semiconductor device and absorbed by the metal constituting the electrode, thus causing the hydrogen embrittlement of the electrode of the optical semiconductor device. Since an electrode suffering from hydrogen embrittlement applies stress to the semiconductor, this causes the variation in the wavelength over time. In contrast, when an oxidizing gas, for example, oxygen, is contained in the inner gas, hydrogen discharged into the interior of the package is consumed by the oxidization caused by the inner gas, thereby hydrogen embrittlement of the electrode metal is prevented. As a result, the variation in the wavelength over time can be suppressed. The above description is an assumption made by the present inventors based on the experimental results about the cause of the wavelength variation and the mechanism of the suppression of the variation over time by adding oxygen. The above description by no means limits the technical scope of the present invention.

In achieving the above-described object, a first embodiment of the present invention provides an optical semiconductor device comprising a semiconductor laser for outputting light having a wavelength of 1.1 $\mu$m or more, a package for hermetically sealing the semiconductor laser, and a inner gas enclosed in the interior of the package, the inner gas containing an oxidizing gas.

According to the first embodiment of the present invention, an oxidizing gas is contained in the inner gas. Thus, the variation in the wavelength of the light output from the semiconductor laser over time is suppressed, as is apparent from the experimental results described above. In the first embodiment, the output wavelength is 1.1 $\mu$m or more. A semiconductor laser outputting light having such a wavelength is often used in optical communications and scientific and industrial analyses and measurements which require suppression of the wavelength variation over time. Accordingly, the optical semiconductor device of the first embodiment is suitable for use as the light source in these applications.

The technology for introducing oxygen into the package is disclosed in Japanese Unexamined Patent Application Publication No. 7-147457, for example. In this known art, oxygen is introduced to suppress the formation of carbonaceous deposits on an end face of the semiconductor laser so as to prevent the degradation in the laser light output which would otherwise be caused by the deposits. However, the specification of this publication neither discloses nor suggests the fact that the variation in the wavelength over time can be suppressed by oxygen.

Moreover, in the semiconductor laser outputting light having a wavelength of 1.1 $\mu$m or more, the absorption of light by the carbonaceous deposits, as described in the above known art, is negligible. Accordingly, the semiconductor laser having an output range suitable for optical communications does not experience degradation in the laser light output. Thus, from the point of view of preventing degradation in the output light intensity, the optical semiconductor device according to the first embodiment of the present invention comprising the semiconductor laser which outputs light having a wavelength of 1.1 μm or more does not require introduction of active oxygen into the inert air.

In the present invention, in order to suppress the variation in the output wavelength over time of the semiconductor laser hermetically sealed in the interior of the package, an oxidizing gas is intentionally introduced into the inner gas even in the semiconductor laser outputting light having a long wavelength which does not suffer from the degradation of the output light intensity. The present invention is made based on the discovery of the fact that the wavelength of the optical semiconductor device using an inert gas as the inner gas varies over time and the fact that this variation in the wavelength over time can be suppressed by introducing oxygen to the inner gas. Thus, the present invention is completely original.

A second embodiment of the present invention provides an optical semiconductor device comprising: a semiconductor laser having an electrode comprising at least one element selected from titanium (Ti), magnesium (Mg), and vanadium (V); a package for hermetically sealing the semiconductor laser; and a inner gas in the interior of the package, the inner gas containing an oxidizing gas.

In the second embodiment, a metal containing at least one of titanium, magnesium, and vanadium is used to form the electrode. As is described above, the wavelength of the semiconductor laser including the electrode comprising such a metal sometimes undergoes significantly large variation over time in an inactive gas. In this embodiment, an oxidizing gas, i.e., oxygen, for example, is introduced into the inner gas so as to suppress the variation in the output light wavelength over time, as in the first embodiment.

The semiconductor laser according to the first embodiment of the present invention may also include the electrode comprising at least one of titanium, magnesium, and vanadium as the electrode for the semiconductor laser. In this manner, the variation in output wavelength over time can be remarkably suppressed, as in the second embodiment.

Alternatively, dry air may be used as the inner gas in both the first and second embodiments. The inner gas may be a mixture of an inert gas and oxygen or ozone. Examples of the inert gases are nitrogen, argon, and helium. Moreover, an oxidation catalyst for hydrogen such as a platinum catalyst may be disposed in the interior of the package of the optical semiconductor device. With the catalyst, the hydrogen discharged into the interior of the package can be readily oxidized, thereby hydrogen embrittlement of the electrode is prevented. Thus, the variation in wavelength of the semiconductor laser over time can be further efficiently suppressed. This catalyst may be installed on a laser carrier for supporting the semiconductor laser, on a submount for supporting the laser carrier and other optical components, or on a cap of the package.

The semiconductor laser may be mounted on a temperature controller comprising, for example, a peltier cooler, disposed in the interior of the package of the optical semiconductor device.

The optical semiconductor device of the present invention is particularly suitable for accommodating a distributed feedback laser (DFB), and a semiconductor laser for wavelength division multiplexing (WDM) optical communications.

The output light of the DFB laser has a significantly narrow spectral width because corrugations are provided in the interior of the laser. In order to fully make use of the narrow spectral width, the wavelength needs to be sufficiently stable. With the optical semiconductor device of the present invention, the wavelength variation over time can be suppressed, and laser beams having a stable central wavelength and a sharp spectrum can be stably output.

In the WDM mode, a plurality of signals can be transmitted through a single optical fiber by using light sources of different wavelengths. The optical semiconductor device of the present invention, which exhibits less variation in the wavelength over time, can be applied to these light sources to adequately maintain the interval between the wavelengths of adjacent light signals and to suppress crosstalk between the wavelengths.

DESCRIPTION OF THE PREFERRED EMBODIMENT

The preferred embodiment of an optical semiconductor device for optical communication using a semiconductor laser as the light source will now be described with reference to the drawings.

Figure 1:
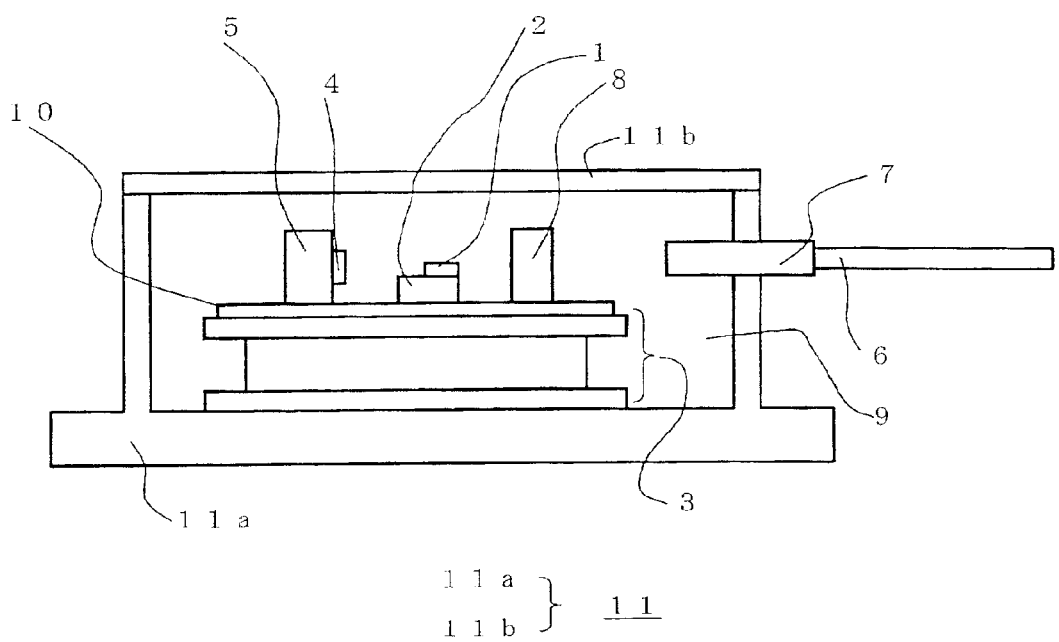
FIG. 1 is a cross sectional view of an optical semiconductor device according to an embodiment of the present invention.

Referring to FIG. 1, a package 11 of an optical semiconductor device of a first embodiment comprises a package base 11a for accommodating components and a cap 11b for hermetically sealing the interior of the package base 11a. In the first embodiment, dry air is filled inside the package 11 as a inner gas 9.

A temperature controller 3 comprising a peltier cooler is disposed on the inner bottom face of the package base 11a of the package 11. A submount 10 is installed on the temperature controller 3. The submount 10 functions as a substrate for integrally forming an optical system that includes, for example, a semiconductor laser 1, a photodetector 4 for measuring the output of the semiconductor laser 1, and a lens holder 8 for supporting a lens (not shown in the drawing) for collimating the light output from the semiconductor laser 1. On the submount 10, a photodetector carrier 5 for securing the photo-detector 4, a laser carrier 2 for securing the semiconductor laser 1, and the lens holder 8 are aligned and fixed along the optical axis. Moreover, a connector 7 for connecting an optical fiber 6 to the optical system in the interior of the package 11 is provided in a sidewall of the package base 11a.

A method for making the optical semiconductor device of the preferred embodiment is now described.

First, the temperature controller 3 and the connector 7 connected to the optical fiber 6 are mounted on the package base 11a. The package base 11a is made of Kovar material or the like.

Next, the semiconductor laser 1 installed on the laser carrier 2, the photo-detector 4 installed to the photo-detector carrier 5, and the lens holder 8 including the lens are mounted on the submount 10. These components mounted on the submount 10 are optically aligned.

The submount 10 is then mounted on the temperature controller 3. The electrodes of the semiconductor laser 1, the photo-detector 4, and the temperature controller 3 are connected by wire bonding to corresponding leads (not shown in the drawing) provided on the package base 11a.

Next, the package base 11a is placed in a chamber filled with dry air, and the cap 11b is bonded on the package base 11a by means of seam welding or the like to hermetically seal the package 11. Resultingly the optical semiconductor device holds dry air (the inner gas 9) in the interior of the package base 11a.

Next, the wavelength variations over time of light output from the optical semiconductor devices of the preferred embodiment were compared with that of a known optical semiconductor device in which nitrogen is filled in the interior of the package. In the following experiment, all three samples of the optical semiconductor device of the preferred embodiment employed electrodes comprising titanium.

Figure 2:
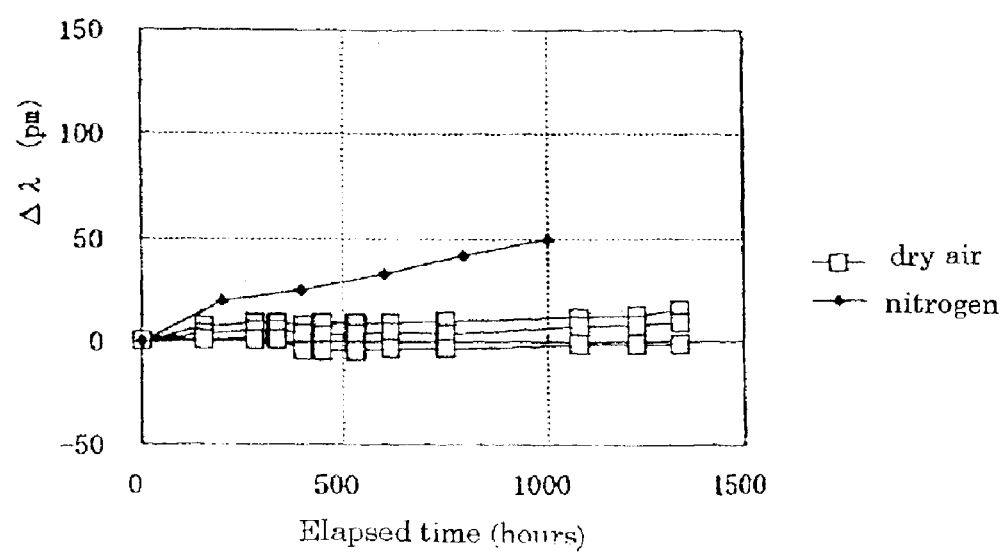
FIG. 2 is a graph showing wavelength variation over time of the optical semiconductor device according to the embodiment of the present invention.

FIG. 2 is a graph showing the wavelength variations over time of the optical semiconductor devices of the present invention using electrodes comprising titanium. In the graph, the wavelength variation over time of a known optical semiconductor device is shown as a comparative example. Each "dry air" shown in FIG. 2 represents the optical semiconductor device of the preferred embodiment, and "nitrogen" shown in FIG. 2 represents the known optical semiconductor device. Referring to FIG. 2, all of the optical semiconductor devices using dry air exhibited wavelength variations Δλ of 20 pm or less after 1,300 hours. In contrast, the known optical semiconductor device exhibited a wavelength variation Δλ of 50 pm after 1,000 hours. As is apparent from FIG. 2, the optical semiconductor devices of the preferred embodiment had remarkably less wavelength variation over time and superior stability compared to the known optical semiconductor device.

It is to be noted that Mg and V suffer from hydrogen embrittlement as does Ti. Thus, the wavelength of the semiconductor laser using electrodes containing Mg or V also varies over time. This variation over time can be suppressed by using dry air as the inner gas, as in the semiconductor laser using electrodes comprising titanium.

In the present invention, a gas containing an oxidizing gas is filled in the interior of the package 11. Thus, when extraneous hydrogen inadvertently enters the interior of the package 11 or when hydrogen is discharged into the interior of the package 11 from the material constituting the package 11, hydrogen is oxidized to form water in the interior of the package 11. As a result, a trace amount of condensed water may be formed at very low temperatures. However, the effect of the condensation is negligible under the actual usage condition of the optical semiconductor devices.

In the above-described embodiment, the gas in the interior of the package is dry air. The gas used in prevent invention may be not only air but gases witch contain an oxidizing gas. Examples of such gases are dry air, a gas mixture of 1% oxygen and 99% nitrogen, and a gas mixture containing ozone instead of oxygen.

As described above, when an electrode comprising at least one element selected from titanium, magnesium, and vanadium is included in the semiconductor laser 1, the wavelength variation has been large according to the known art. The present invention suppresses the wavelength variation. Thus, the present invention is particularly suitable for use in devices using electrodes comprising these elements.

Furthermore, in order to prevent deterioration of the electrodes caused by hydrogen embrittlement due to hydrogen in the interior of the package, a platinum catalyst, for example, is preferably provided in the interior of the package. As described above, since an oxidizing gas is in the interior of the package, the catalyst promotes the reaction of hydrogen and the oxidizing gas so as to reduce the hydrogen concentration in the interior of the package and to suppress hydrogen embrittlement.

According to the present invention, the wavelength variation over time of the light output from the optical semiconductor device having a semiconductor laser in the interior of the package can be suppressed. As a result, the optical semiconductor device has a stable wavelength and achieves high reliability. The present invention significantly contributes to improving the quality of optical communications such as WDM communications and to improving the accuracy of scientific and industrial analysis and measurement.

What is claimed is:

1. An optical semiconductor device comprising:
   a semiconductor laser outputting light having a wavelength of 1.1 $\mu$m or more, said semiconductor laser having an electrode comprising at least one element selected from the group consisting of titanium, magnesium, and vanadium;
   a package for hermetically sealing the semiconductor laser; and
   an inner gas containing an oxidizing gas and filling the interior of the package, such that a wavelength variation of the output light of the laser being smaller than 50pm upon long term operation.

2. An optical semiconductor device according to claim 1, wherein the inner gas is dry air.

3. An optical semiconductor device according to claim 1, wherein the oxidizing gas is one of oxygen and ozone.

4. An optical semiconductor device according to claim 3, the inner gas further containing at least one gas selected from the group consisting of nitrogen, argon, and helium.

5. An optical semiconductor device according to claim 1, wherein the package accommodates a temperature controller for controlling the temperature of the semiconductor laser.

6. An optical semiconductor device according to claim 5, wherein the temperature controller comprises a peltier element.

7. An optical semiconductor device comprising:
   a semiconductor laser outputting light having a wavelength of 1.1 $\mu$m or more;
   a package for hermetically sealing the semiconductor laser;
   an inner gas containing an oxidizing gas and filling the interior of the package; and
   a catalyst for accelerating bonding of hydrogen and oxygen, the catalyst being provided in the interior of the package.

8. An optical semiconductor device according to claim 7, wherein the catalyst comprises platinum.

9. An optical semiconductor device according to claim 7, further comprising a laser carrier for mounting the semiconductor laser, the laser carrier being provided with the catalyst.

10. An optical semiconductor device according to claim 7, further comprising a submount for mounting the semiconductor laser, the submount being provided with the catalyst.

11. An optical semiconductor device according to claim 7, wherein the package comprises a cap, and the cap is provided with the catalyst.

12. An optical semiconductor device comprising:
    a semiconductor laser outputting light having a wavelength of 1.1 $\mu$m or more, said a package for hermetically sealing the semiconductor laser; and an inner gas containing an oxidizing gas and filling the interior of the package, such that a wavelength variation of the output light of the laser being smaller than 50 pm upon long term operation.

13. An optical semiconductor device according to claim 12, wherein the inner gas is dry air.

14. An optical semiconductor device according to claim 12, wherein the inner gas is one of oxygen or ozone.

15. An optical semiconductor device according to claim 14, the inner gas further containing at least one gas selected from the group consisting of nitrogen, argon and helium.

16. An optical semiconductor device according to claim 12, wherein the package accommodates a temperature controller for controlling the temperature of the semiconductor laser.

17. An optical semiconductor device according to claim 16, wherein the temperature controller comprises a peltier element.

18. An optical semiconductor device according to claim 12, wherein the semiconductor laser is a distributed feedback (DFB) laser.

19. An optical semiconductor device according to claim 12, wherein the semiconductor device functions as a light source for wavelength division multiplexing (WDM) communications.

* * * * *